(12) United States Patent
Yamaguchi

(10) Patent No.: US 6,644,842 B2
(45) Date of Patent: Nov. 11, 2003

(54) VEHICLE HEADLIGHT DISCHARGE LAMP

(75) Inventor: Hironao Yamaguchi, Gamagori (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/151,875

(22) Filed: May 22, 2002

(65) Prior Publication Data

US 2003/0058656 A1 Mar. 27, 2003

(30) Foreign Application Priority Data

Jun. 11, 2001 (JP) ........................................ 2001-175972

(51) Int. Cl.[7] ................................................. B60Q 1/28
(52) U.S. Cl. ....................... 362/547; 362/546; 362/512; 362/277
(58) Field of Search ................................. 362/546, 547, 362/267, 310, 294, 277, 269, 319, 507, 512, 513, 538, 539; 313/113, 25, 46

(56) References Cited

U.S. PATENT DOCUMENTS 5,113,330 A * 5/1992 Makita ........................ 362/265
5,188,444 A * 2/1993 Makita et al. ............... 362/519
5,865,531 A    2/1999 Frey et al.

FOREIGN PATENT DOCUMENTS

| JP | 403136938 A | * 6/1991 |
| JP | A-10-228804 | 8/1998 |
| JP | A-2000-235809 | 8/2000 |

* cited by examiner

Primary Examiner—Sandra O'Shea
Assistant Examiner—Hargobind S Sawhney
(74) Attorney, Agent, or Firm—Posz & Bethards, PLC

(57) ABSTRACT

A vehicle head lamp has a lighting control circuit that is cooled in temperature by positioning a portion of the lighting control circuit exterior to the lamp housing to use outside air as coolant to reduce thermal loads applied to circuit elements. The lamp housing defines an opening at a side of the lighting control circuit. An end surface of the lighting control circuit is exposed to the opening to an exterior side of the lamp housing. A flexible, annular diaphragm is fixed to the lamp housing around the peripheral portion of the opening. An inner circumferential portion of the diaphragm contacts a peripheral portion of the lighting control circuit to effectively seal around the lighting control circuit.

18 Claims, 6 Drawing Sheets

VEHICLE HEADLIGHT DISCHARGE LAMP

CROSS REFERENCE TO RELATED APPLICATION

This application is based upon, and claims the benefit of priority of, prior Japanese Patent Application 2001-175972, filed on Jun. 11, 2001, the contents of which are incorporated herein by reference.

BACKGROUND OF THE INVENTION

1. Technical Field of the Invention

The present invention relates to a vehicle head lamp utilizing a discharge lamp.

2. Description of Related Art

Generally, discharge lamps are used as vehicle head lamps. The discharge lamp is an arc-discharge type lamp in which xenon gas, or the like, is enclosed in a discharge lamp bulb (arc tube), and light is emitted from the discharge lamp bulb using discharge generated between a pair of electrodes therein. The light emitted from the discharge lamp bulb is white light similar to sun light. A quantity of light from the discharge lamp can be equal to or more than twice as much as that from a conventional halogen lamp while using about 30% of the electric power compared to the halogen lamp. Accordingly, when the discharge lamp is used as a vehicle head lamp, visibility in front of the vehicle is improved.

When the discharge lamp is turned on, a high voltage of several kV to tens of kV is applied to the discharge lamp, thereby instantly starting discharge therein, and lighting it. Thereafter, electric power of about 35W is applied to maintain a lit condition. Therefore, a dedicated lighting-control circuit is required to light the discharge lamp. A lighting control circuit is mainly constructed by a converter, an inverter and an igniter. The converter increases the direct-current (DC) voltage from a battery, and the inverter converts a DC voltage to an alternating-current (AC) voltage. The igniter generates a high voltage of tens of kV.

In a vehicle, the lighting control circuit is generally mounted outside the head lamp housing. In this case, high voltage wires and connectors, used for applying a high voltage to the discharge lamp, are required, thereby not reducing the size of the head lamp and its peripheral circuit. Further, labor hours for attachment and wiring of the high voltage wires and connectors are required while a certain amount of space for the wires and the connectors is required. Furthermore, the high voltage wire requires shielding for reducing adverse effects of electrical noises from the wire itself, thereby increasing production costs of the head lamp and its peripheral circuit.

Therefore, it can be considered that the lighting control circuit is mounted directly on the discharge lamp bulb in the lamp housing. For example, it is conceived that the discharge lamp bulb is connected directly to a connector contained in the lighting control circuit while the lighting control circuit is fixed to a rear surface of a reflector. According to this arrangement, no high voltage wire is required between the discharge lamp bulb and the lighting control circuit while the size of the vehicle head lamp can be reduced, thereby eliminating radio wave noises and power losses due to the high voltage wires.

While the discharge lamp bulb is lit, its temperature becomes high. Generally, ventilation holes are provided in the lamp housing to eliminate any pressure differences between the inside and the outside of the lamp housing. However, the area of each ventilation hole is set at a desired minimum to prevent water and foreign matter from entering into the lamp housing, which causes almost no air stream is generated in the lamp housing. Therefore, while the discharge lamp bulb is lit, the air temperature in the lamp housing becomes high. That is, a temperature of the lighting control circuit becomes high by receiving heat directly from the discharge lamp bulb through thermal conduction and thermal radiation while the temperature of air around the lighting control circuit becomes high. Thus, it is feared that excessive thermal loads may be applied to circuit elements contained in the lighting control circuit. Although circuit elements and a circuit board, each having a high thermal resistance, may be used as one remedy for this problem, production costs and the size of the lighting control circuit will increase.

As another remedy, the lamp housing may define an opening, and a portion of the lighting control circuit fixed to the reflector may be exposed to the outside through the opening in the lamp housing. Thus, the lighting control circuit is cooled using outside air, and its temperature is prevented from increasing. In this case, a sealing member is required to close a clearance between the lighting control circuit and the lamp housing at the opening which exposes the lighting control circuit to seal the lamp housing.

In attachment processes of the vehicle head lamp, an optical axis is adjusted by moving the reflector. Further, some vehicle head lamps include a leveling mechanism. In the leveling mechanism, when vehicle posture (position) changes due to changes in passenger arrangement or changes in the load condition, the optical axis of the head lamp is maintained in a predetermined direction by moving the reflector through the use of a motor or an actuator. A clearance varies between the lighting control circuit and the lamp housing on every vehicle head lamp due to driving conditions. Therefore, the clearance therebetween is difficult to securely seal.

SUMMARY OF THE INVENTION

The present invention has been made in view of the above problems. An object of the present invention is to provide a vehicle head lamp so the temperature of the lighting control circuit can be effectively prevented from increasing. That is, a portion of the lighting control circuit fixed to the reflector is exposed outside the lamp housing while the lamp housing remains hermetically sealed regardless of the posture of the reflector. Thus, a temperature of the lighting control circuit can be effectively prevented from increasing by using outside air.

In the present invention, the following technological means are adopted to attain the above object. A lamp housing defines an opening at a side of a lighting control circuit. An end portion of the lighting control circuit is exposed to an exterior by the opening in the lamp housing. Further, a seal member is formed by a flexible material substantially in an annular shape, and an outer circumferential portion of the seal member is tightly fixed to the lamp housing around a peripheral portion of the opening. An inner circumferential portion of the seal member is tightly fixed to or press-contacted to the lighting control circuit at a peripheral side of its end portion. Thus, since the seal member can be deformed to adjust to posture changes of the reflector, the lighting control circuit can be cooled using an outside air stream while the lamp housing is surely sealed. That is, a portion of the lighting control circuit fixed to the reflector is exposed outside the lamp housing. Therefore, the temperature of the lighting control circuit can be prevented from increasing, and thermal loads applied to circuit elements can be reduced or maintained.

The vehicle head lamp further includes an actuator for moving the reflector. Accordingly, when vehicle posture (position) change due to changes in passenger arrangement within the vehicle and/or changes of the vehicle's load condition, the optical axis of the head lamp is maintained in a predetermined direction by moving the reflector using an actuator (leveling mechanism). Also in the vehicle head lamp, a portion of the lighting control circuit fixed to the reflector is exposed outside the lamp housing and the lighting control circuit can be cooled using an outside air stream. Therefore, the temperature of the lighting control circuit can be prevented from increasing, and thermal loads applied to circuit elements can be reduced.

Additionally, the vehicle head lamp may include a heat radiation member formed by a high thermal-conduction material. The heat radiation member is fixed to the lighting control circuit and the seal member is tightly fixed to or press-contacted to the heat radiation member. Therefore, an outer circumferential shape of the heat radiation member is optimized to improve adhesion between the heat radiation member and the seal member, thereby securely sealing the lamp housing. Additionally, the lighting control circuit includes heat radiation fins exposed by the opening to the lamp housing exterior. Therefore, the lighting control circuit can be effectively cooled using an outside air stream. Also, a seal member is constructed by a plurality of components. Therefore, an inner circumferential shape of the seal member is optimized to improve adhesion between the lighting control circuit and the seal member, thereby securely sealing the lamp housing.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

Figure 1:
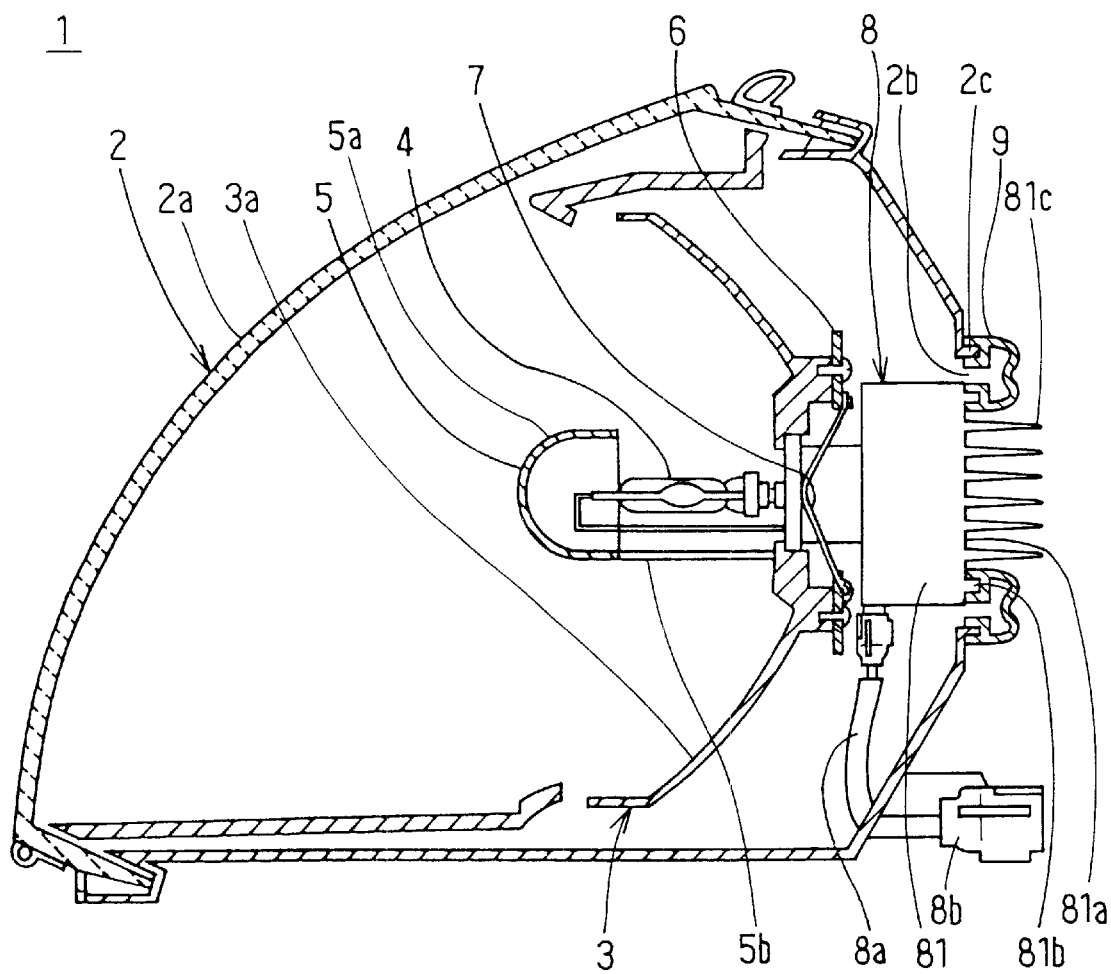
FIG. 1 is a cross-sectional view showing a vehicle head lamp according to a first embodiment of the present invention.

The following description of the preferred embodiment(s) is merely exemplary in nature and is in no way intended to limit the invention, its application, or uses.

Hereinafter, the present invention will be described with reference to embodiments shown in the drawings. In the drawings, the same components are indicated by the same reference numerals.

(First Embodiment)

Figure 2:
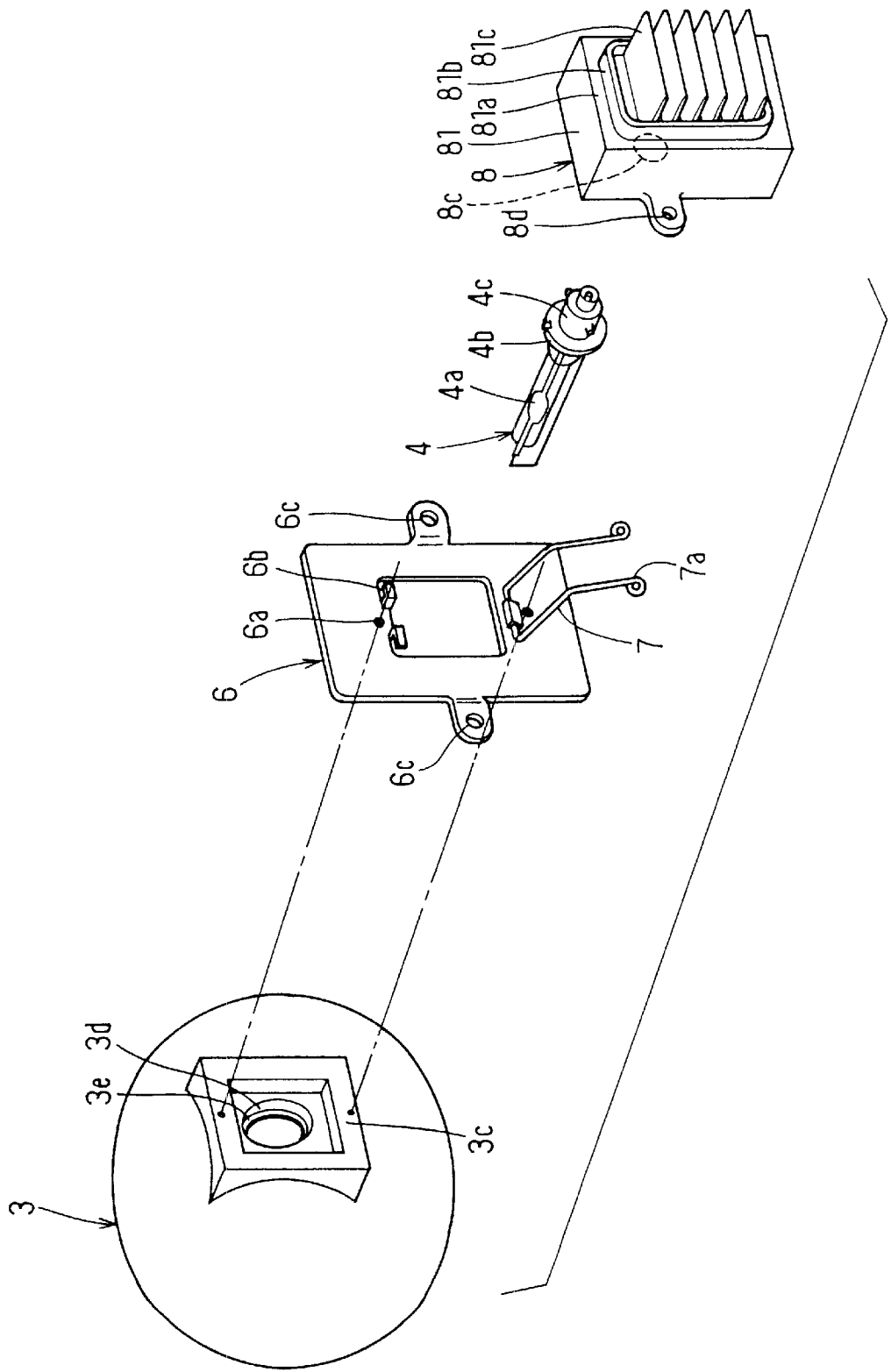
FIG. 2 is an exploded perspective view showing main components of the vehicle head lamp according to the first embodiment.

FIG. 1 is a cross-sectional view showing a vehicle head lamp 1 according to a first embodiment of the present invention. When the vehicle head lamp 1 is mounted in a vehicle, the front of the vehicle is to the left side of FIG. 1 and the rear of the vehicle is at the right side of FIG. 1. The top of the vehicle is toward the top of FIG. 1 and the bottom of the vehicle is toward the bottom of FIG. 1. FIG. 2 is an exploded perspective view showing main components of the vehicle head lamp 1.

As shown in FIG. 1, the vehicle head lamp 1 includes a reflector 3, a discharge lamp bulb 4, a shade 5, a lighting control circuit 8 and a holder 6 in a lamp housing 2. A lens 2a is integrated to the lamp housing 2, and a reflecting mirror 3a is formed on a surface of the reflector 3 (at a side of the discharge lamp bulb 4). The shade 5 shields a portion of light emitted from the discharge lamp bulb 4 to prevent the emitted light from being directly directed forward. The holder 6, attached to a rear surface of the reflector 3, holds the lighting control circuit 8 and fixes it to the reflector 3. In the present embodiment, the lighting control circuit 8 is disposed on the rear surface of the reflector 3.

The lamp housing 2 is a molded resin body, and it integrally includes the transparent lens 2a at a vehicle front side as shown in FIG. 1. The reflector 3, the discharge lamp bulb 4 and the lighting control circuit 8 are contained in the lamp housing 2. Further, the lamp housing 2 includes an opening 2b at a side of the lighting control circuit 8. The opening 2b is provided substantially in a circular shape so that the holder 6 for attaching the lighting control circuit 8 to the reflector 3 can pass through the opening 2b. In assembling processes of the vehicle head lamp 1, these components are attached to the reflector 3 in the lamp housing 2 through the opening 2b, and an optical axis is adjusted through the opening 2b. The discharge lamp bulb 4 can be exchanged and the lighting control circuit 8 can be examined through the opening 2b when the vehicle head lamp 1 is mounted in a vehicle. A wall portion 2c, provided on the lamp housing 2 around a peripheral portion of the opening 2b, protrudes toward an outside of the lamp housing 2 (right side in FIG. 1). The wall portion 2c is fitted and tightly fixed into a first groove 9a provided in a diaphragm which will be described later.

The discharge bulb 4 includes a light emitter 4a, a flange 4b to be held by the reflector 3, and a male connector 4c to be electrically connected to the lighting control circuit 8. The flange 4b and the connector 4c are located at one end side of the light emitter 4a.

The shade 5, for shielding a portion of light emitted from the discharge lamp bulb 4, is formed of a metal material. The shade 5 includes a bowl portion 5a, substantially having a hemispheric shape, and a holding portion 5b. The bowl portion 5a is held at one end of the holding portion 5b, and the other end of the holding portion 5b is fixed to the reflector 3. The bowl portion 5a is disposed so as to cover a front side of the discharge lamp bulb 4, and the bowl portion 5a prevents light from being directly radiated forward from the discharge lamp bulb 4. Thus, the light radiated toward the front of the vehicle is light solely reflected by the reflector 3. This permits light to be reflected in a predetermined pattern or distribution. Further, the bowl portion 5a shields radio wave and other noise frequencies radiating forward from the discharge lamp bulb 4.

The reflector 3 includes the reflecting mirror 3a at its front side and a holding portion 3d at its center. The reflecting mirror 3a has a concave shape, and the holding portion 3d is for holding the discharge lamp bulb 4. The reflector 3 is formed only by a metal material or by combination of two or more materials such as metal materials and nonmetal materials. Here, resin materials and the like are considered to be the nonmetal materials. For example, it is considered as the combination of a nonmetal material and a metal material that an aluminum film is deposited on a resin material. Here, the discharge lamp bulb 4 (specifically, the light emitter 4a) is required to be disposed at a predetermined position with respect to the reflecting mirror 3a so that the vehicle head lamp 1 can direct light at a particular angle or in a predetermined direction or array. The flange 4b of the discharge lamp bulb 4 is inserted into the holding portion 3d, and a side end surface of the flange 4b at a side of the light emitter 4a is made to contact a positioning stopper 3e, thereby accurately holding the discharge lamp bulb 4 at a predetermined position with respect to the reflecting mirror 3a. Thus, the reflector 3 is constructed so that a predetermined pattern of vehicle light distribution can be obtained by reflecting light, emitted from the discharge lamp bulb 4, forward using the reflecting mirror 3a. Further, an attachment surface 3c, to which the holder 6 is attached, is provided on the reflector 3 at its rear side. The lighting control circuit 8 is attached to the holder 6. That is, the lighting control circuit 8 is attached to the reflector 3 at the rear side through the holder 6.

The lighting control circuit 8 is a lighting circuit for controlling the lighting of the discharge lamp bulb 4, and it includes an electrical circuit contained in a substantial rectangular case 81. The electrical circuit is constructed by a converter, an inverter, an igniter and the like. The converter increases a direct-current (DC) voltage from a battery (not shown), and the inverter converts a DC voltage to an alternating-current (AC) voltage. The igniter generates the high voltage required to start to light the discharge lamp bulb 4. The electrical circuit controls electrical power to light the discharge lamp bulb 4. The lighting control circuit 8 is attached to the holder 6, and the holder 6 is attached to the reflector 3 at its rear side. The lighting control circuit 8 contains a female connector 8c, and directly connects to the discharge lamp bulb 4 through the female connector 8c without lead wires. A lead wire 8a, having a connector 8b at its end, is brought out from the lighting control circuit 8. Electric power is supplied to the lighting control circuit 8 from the battery through the lead wire 8a. Further, the lighting control circuit 8 includes an attachment hole 8d used for attaching the lighting control circuit 8 to the holder 6.

Here, the lighting circuit, for controlling the lighting of the discharge lamp bulb 4, is all of the lighting control circuit 8 including the converter, the inverter and the igniter. Otherwise, the lighting circuit is the igniter or a circuit at least including the igniter.

The case 81 of the lighting control circuit 8 is formed by a high thermal-conductive material such as aluminum. A wall portion 81b is provided on an end surface 81a of the case 81 at an opposite side of the reflector 3 (right side in FIG. 1) around its peripheral portion, and it protrudes toward an outside of the lamp housing 2 (toward the right side in FIG. 1). The wall portion 81b is fitted in and tightly fixed into a second groove 9b provided in the diaphragm 9, to be described later. Further, heat radiation fins 81c for cooling the lighting control circuit 8 are provided on the end surface 81a inside the wall portion 81b. The heat radiation fins 81c are exposed outside the lamp housing 2 and since the heat radiation fins 81c are exposed to outside air, the lighting control circuit 8 can be effectively cooled.

The holder 6, for attaching the lighting control circuit 8 to the reflector 3, is formed by resin or metal. The holder 6 includes a hole 6a corresponding to the attachment surface 3c of the reflector 3, and it is attached to the attachment surface 3c using a screw inserted through hole 6a. Further, a spring 7, for pressing and fixing the discharge lamp bulb 4 to the reflector 3, is rotatably held by the holder 6. Latches 6b, for latching both ends 7a of the spring 7, are provided on the holder 6. Furthermore, the holder 6 includes a screw hole 6c used for attaching the lighting control circuit 8 to the holder 6.

Figure 3:
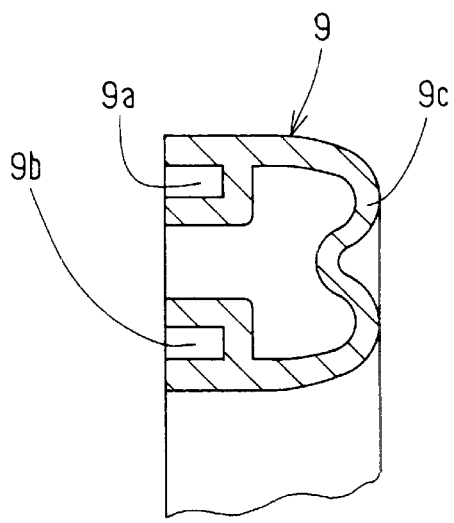
FIG. 3 is an enlarged cross-sectional view showing a diaphragm of the vehicle head lamp according to the first embodiment.

The diaphragm 9 is a seal member for sealing the clearance between the lamp housing 2 and the lighting control circuit 8 while a portion of the lighting control circuit 8 is exposed outside the lamp housing 2. The diaphragm 9 is formed substantially in an annular shape by flexible rubber or a flexible resin. FIG. 3 is an enlarged cross-sectional view showing the diaphragm 9. As shown in FIG. 3, the first groove 9a is provided in a bellows of the diaphragm 9 at an outer circumferential portion, and the second groove 9b is provided in the bellows 9c at an inner circumferential portion. The first and second grooves 9a, 9b are provided on the same center axis of the bellows 9c. The wall portion 2c of the lamp housing 2 is fitted in the first groove 9a, and the wall portion 81b of the lighting control circuit 8 is fitted in the second groove 9b, thereby securely sealing the lamp housing 2.

Next, a description of an assembling method of the vehicle head lamp 1 according to the embodiment of the present invention will be made. In the above description, the reflector 3 has been attached to the lamp housing 2, and the shade 5 has been attached to the reflector 3. The cover 2c (wall portion) has been removed from the lamp housing 2. Then, the holder 6 is fixed to the attachment surface 3c of the reflector 3 using a screw. The spring 7 has already been rotatably attached to the holder 6.

Then, the discharge lamp bulb 4 is attached to the reflector 3. The flange 4b of the discharge lamp bulb 4 is inserted into the holding portion 3d while fitted thereto, and its end surface at the side of the light emitter 4a is made to contact the positioning stopper 3e. Then, both ends 7a of the spring 7 are latched to the latches 6b of the holder 6 while the spring 7 is made to contact the flange 4b, thereby pressing and fixing the discharge lamp bulb 4 to the reflector 3.

Then, the lighting control circuit 8 is attached to the reflector 3. The female connector 8c of the lighting control circuit 8 is connected with the male connector 4c of the discharge lamp bulb 4. Thereafter, the lighting control circuit 8 is fixed to the holder 6 using a screw inserted through the attachment hole 8d and the female screw hole 6c.

Then, the diaphragm 9 is attached to the lamp housing 2 and the lighting control circuit 8 while the wall portions 2c, 81b are fitted in and tightly fixed into the first and second grooves 9a, 9b, respectively to prevent water and foreign matter from entering into the lamp housing 2. At last, the optical axis is adjusted in a required radiation direction by moving the reflector 3 while the discharge lamp bulb 4 is lit by supplying electrical power to the lighting control circuit 8.

Here, a clearance structure is variable between the lamp housing 2 and the lighting control circuit 8 at the opening 2b every vehicle head lamp 1 due to dimensional variations of components and the above optical axis adjustment. However, the diaphragm 9 is formed by a flexible material, and it includes the readily flexible bellows 9c. Therefore, the diaphragm 9 is readily adjustable to the above variation of the clearance structure, thereby securely sealing the lamp housing 2 at the clearance between the lamp housing 2 and the lighting control circuit 8.

In the vehicle head lamp 1 according to the first embodiment described above, the lamp housing 2 defines the opening 2b opened at a side of the lighting control circuit 8 fixed to the reflector 3. The end surface 81a of the case 81 of the lighting control circuit 8 is exposed outside of the lamp housing 2. Further, the diaphragm 9 is formed in substantially an annular shape by a flexible material, and its outer circumferential portion is tightly fixed to the lamp housing 2 around the peripheral portion of the opening 2b. Its inner circumferential portion is tightly fixed to or press-fitted to the end surface 81a of the case 81 at an end peripheral side. Thus, the end surface 81a is exposed outside the lamp housing 2, and the lighting control circuit 8 can be cooled using an outside air stream. Therefore, the temperature of the lighting control circuit 8 can be prevented from increasing, and thermal loads applied to the circuit elements can be reduced.

Further, a position of the lighting control circuit 8 may be varied together with the reflector 3 by an optical axis adjustment. Even at this time, the diaphragm 9, formed by a flexible material, is readily adjustable to the variation, thereby securely sealing the lamp housing 2.

(Second Embodiment)

Figure 4:
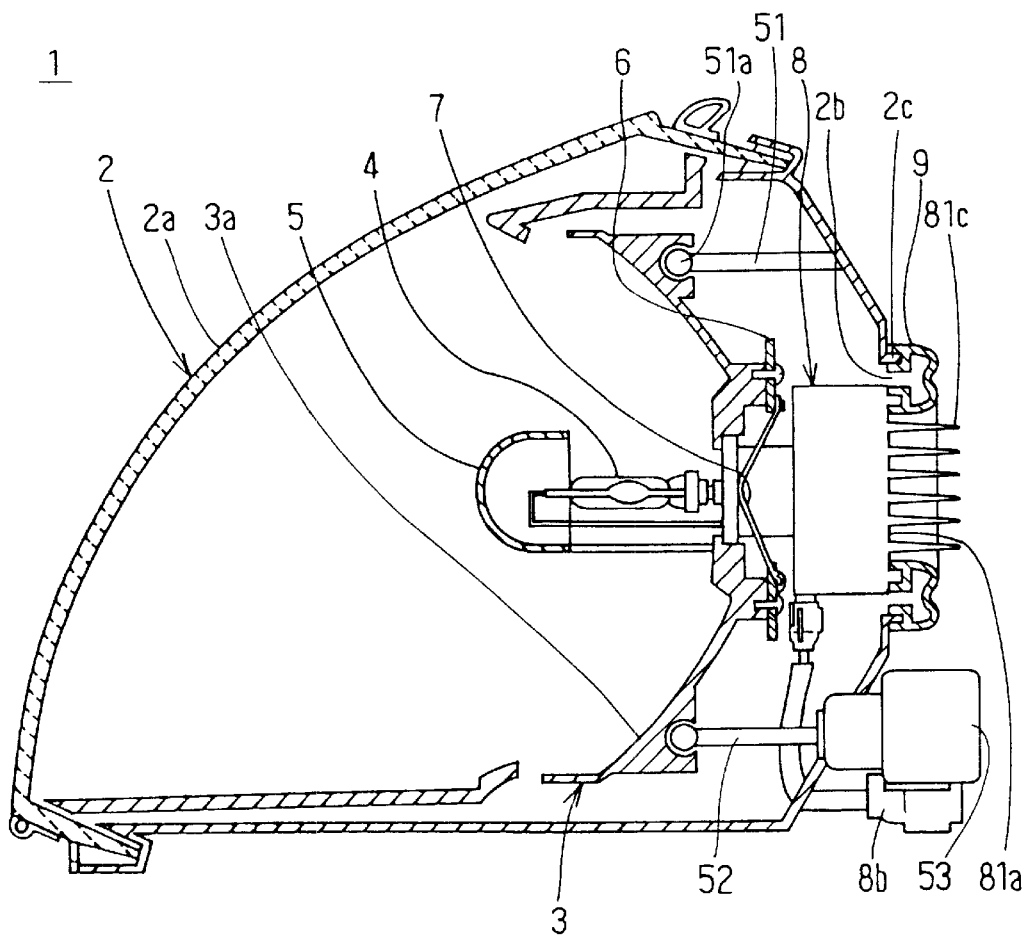
FIG. 4 is a cross-sectional view showing a vehicle head lamp according to a second embodiment of the present invention.

FIG. 4 is a cross-sectional view showing a vehicle head lamp 1 according to a second embodiment of the present invention. In the second embodiment, the vehicle head lamp 1 includes a leveling mechanism. In the leveling mechanism, when vehicle posture is changed due to changes in passenger arrangement and/or changes in loading conditions, the optical axis of the head lamp is maintained in a predetermined direction by moving the reflector 3 with an actuator. Vehicle posture is simply the overall position of the vehicle, with respect to a common vertical and horizontal reference, at any given time.

The leveling mechanism is constructed by a rod-shaped supporting portion 51, a rod-shaped movable portion 52, and an actuator such as a stepping motor 53. The supporting portion 51 and the movable portion 52 movably support the reflector 3 in a direction indicated by circular-arc arrow A in FIG. 4. The stepping motor 53 drives the movable portion 52 in a direction indicated by an arrow B in FIG. 4. Therefore, the movable portion 52 is driven by the stepping motor 53 in the direction indicated by the arrow B, so that the reflector 3 is rotated about a tip portion 51a of the supporting portion 51 as a support in the direction indicated by the circular-arc arrow A. Thus, the optical axis of the vehicle head lamp 1 adjusts.

Figure 5:
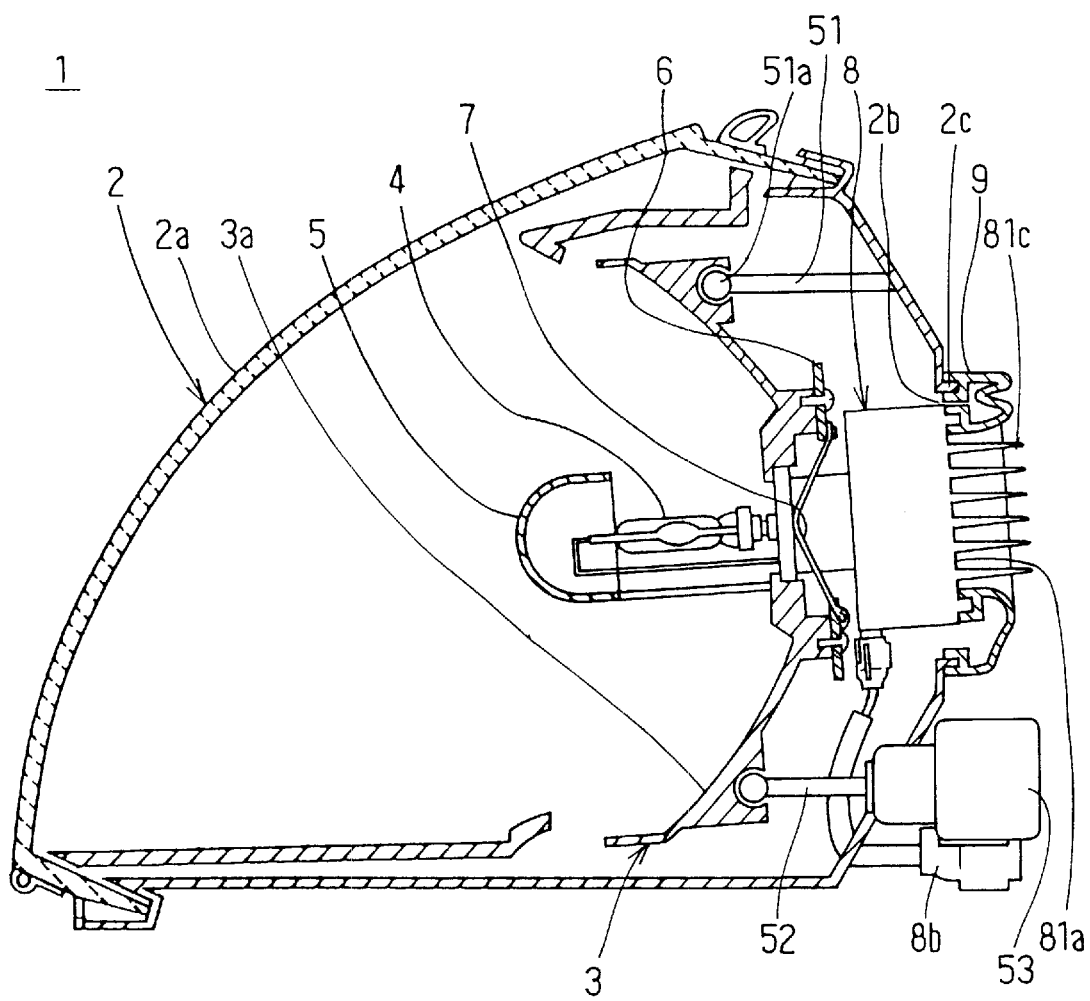
FIG. 5 is a cross-sectional view showing the vehicle head lamp 1, according to the second embodiment, where its optical axis is adjusted using a leveling mechanism.

Next, operations of the leveling mechanism will be described. For example, in a vehicle (not shown) where the optical axis of the vehicle head lamp 1 has been adjusted in a predetermined direction, a rear portion of the vehicle will descend due to a load on the rear portion. Therefore, the optical axis changes to an upward position, thereby lighting and blinding an opposing vehicle, pedestrian, or the like. However, in the second embodiment, the stepping motor 53 is operated, and the movable portion 52 is moved rightward with respect to FIG. 4. Then, the reflector 3 is rotated about the tip portion 51a as a rotation center in a counter clockwise direction in FIG. 4, and it is located as indicated in FIG. 5. Thus, the optical axis of the vehicle head lamp 1 is moved downward and is adjusted in the predetermined direction. At this time, as shown in FIG. 5, the diaphragm 9 shrinks (contracts) at an upper side and extends (expands) at a lower side, thereby surely sealing the lamp housing 2.

In this state, when the load is removed from the rear portion, the rear portion ascends (moves upward), and vehicle posture is returned to its pre-loaded, original posture. However, since the optical axis has been changed downward, faraway visibility of a driver has been reduced. Therefore, the stepping motor 53 is operated, and the movable portion 52 is moved leftward in FIG. 5. Then, the reflector 3 is rotated about supporting tip portion 51a in a clockwise direction in FIG. 5, and it is again returned to the state shown in FIG. 4. Thus, the optical axis of the vehicle head lamp 1 is moved upward, and it is adjusted to the predetermined (original) direction.

To control the direction of head lamp 1, the vehicle posture can be detected by detecting relative displacement between a front-wheel axle and a vehicle body and that between a rear-wheel axle and the vehicle body. Generally, in the leveling mechanism, a rotatable angle area of the reflector 3 is larger than that at the optical axis adjustment in the assembling processes of the vehicle head lamp 1. Therefore, in the leveling mechanism, relative displacement of the lighting control circuit 8 to the lamp housing 2 at the opening 2b becomes larger than that at the optical axis adjustment in the assembling processes.

However, also in the second embodiment, the flexible diaphragm 9 is readily adjustable to the changes as in the first embodiment. Therefore, the end surface 81a of the case 81 of the lighting control circuit 8 remains exposed outside the lamp housing 2, and the lighting control circuit 8 can be cooled using an outside air stream while the lamp housing 2 is securely sealed. Accordingly, the temperature of the lighting control circuit 8 can be prevented from increasing, and thermal loads applied to the circuit elements can be reduced.

In the second embodiment, although the reflector 3 is rotated by the stepping motor 53, another actuator such as a DC motor and a linear solenoid motor may be used. This permits the reflector 3 to pivot within the lamp housing 2 to adjust and maintain the direction of the beam of light emitted to the exterior of the lamp housing 2. At the same time, the lighting control circuit 8 maintains its temperature since a portion of the lighting control circuit 8 protrudes through the opening 2b surrounded by the flexible diaphragm 9.

(Third Embodiment)

Figure 6:
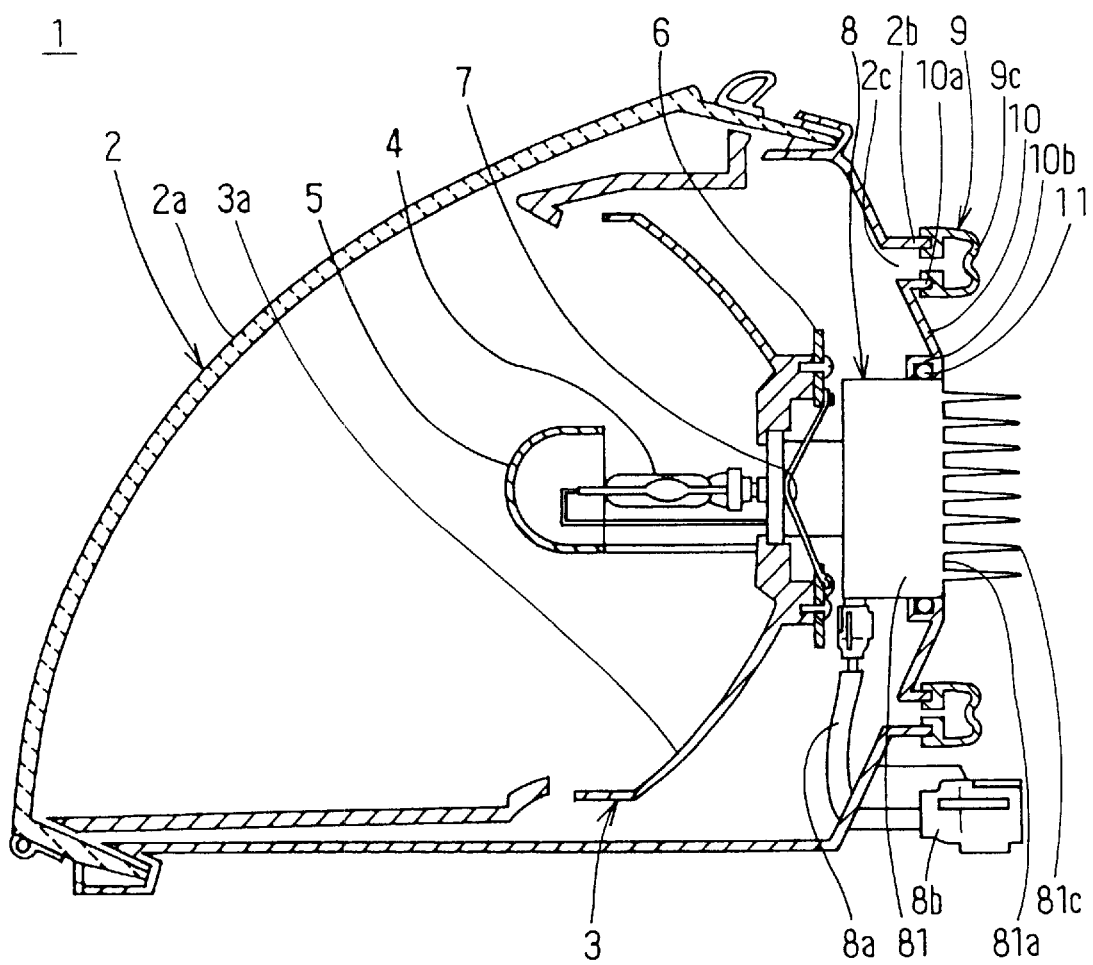
FIG. 6 is a cross-sectional view showing a vehicle head lamp 1 according to a third embodiment of the present invention.

FIG. 6 is a cross-sectional view showing a vehicle head lamp 1 according to a third embodiment of the present invention. In the third embodiment, seal member is constructed by plural components, that is, three components consisting of a diaphragm 9, a cover 10 and an O-ring 11. The cover 10 is integrally formed by resin in substantially an annular shape. A wall portion 10a, protruding to an outside of the lamp housing 2 (at the right side in FIG. 1), is provided on the cover 10 around its outer circumferential portion. The wall portion 10a is fitted in and is tightly fixed to the first groove 9a provided in the diaphragm 9. Further, a groove 10b is provided in the cover 10 around its inner circumferential portion, and the O-ring 11 is fitted in the groove 10b.

Next, description will be made on an assembling method of the vehicle head lamp 1 according to the third embodiment. The cover 10 is fitted onto a peripheral portion of the lighting control circuit 8 after the O-ring 11 is fitted in the groove 10b of the cover 10. That is, the cover 10 is integrally fixed to the lighting control circuit 8 while a clearance is sealed by the O-ring 11 between the lighting control circuit 8 and the cover 10. Then, the diaphragm 9 is attached to the lamp housing 2 and the cover 10 while the wall portions 2b, la are fitted in and tightly fixed into the first and second grooves 9a, 9b, respectively. Thus, the assembling process of the vehicle head lamp 1 is complete.

Also in the third embodiment described above, the same effects as in the first embodiment can be obtained with respect to cooling the lighting control circuit 8 and sealing the lamp housing 2.

It is desired that the diaphragm 9 have an annular shape or a shape as close as possible to an annular shape in view of the attachment performance of the diaphragm 9. The opening 2b of the lamp housing 2 has substantially a circular shape, but the lighting control circuit 8 generally has a substantially rectangular shape. Therefore, the wall portion 81b of the lighting control circuit 8 is formed substantially in a rectangular shape (in a small arc circular shape at each corner) to improve its radiation performance, that is, to enlarge its exposed area as large as possible. Accordingly, trouble may occur in the attachment performance of the diaphragm 9. However, in the third embodiment, the wall portion 10a is provided on the cover 10 in place of the wall portion 81a of the lighting control circuit 8, and the wall portion 10a is fitted in the second groove 9b of the diaphragm 9. Therefore, the wall portion 10a can be formed in a circular shape or substantially in a circular shape, thereby improving the attachment performance of the diaphragm 9.

(Fourth Embodiment)

Figure 7:
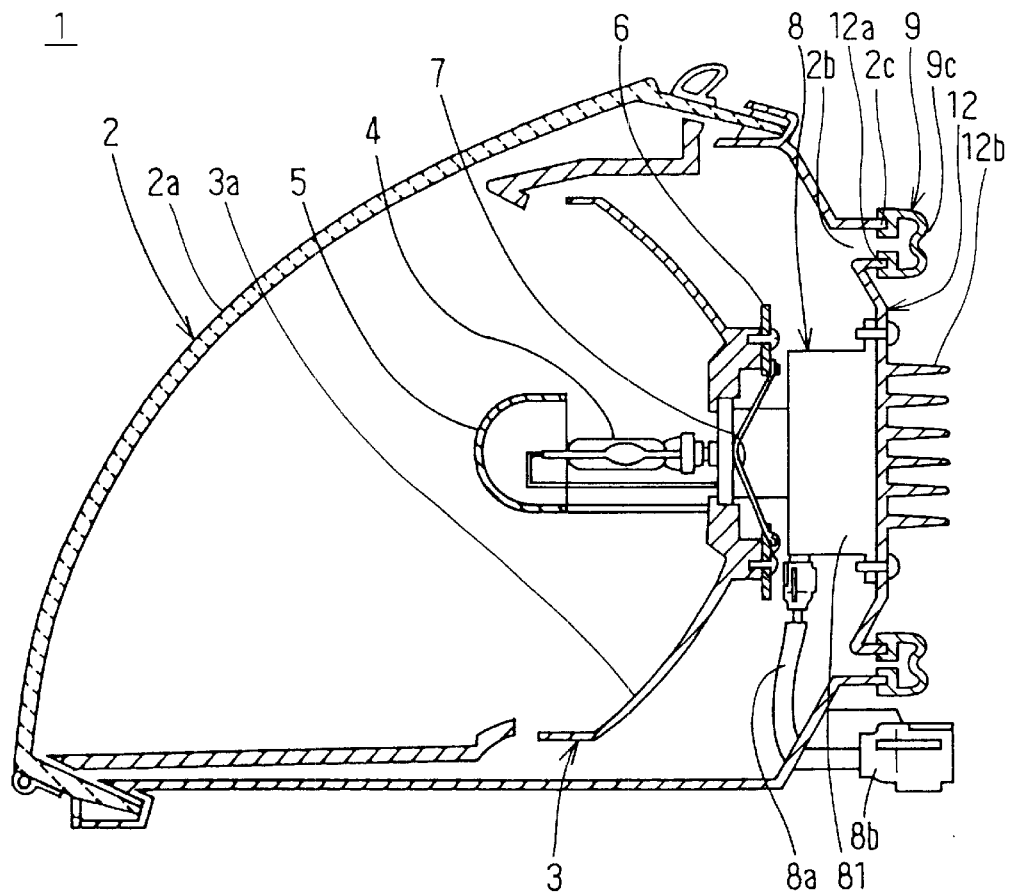
FIG. 7 is a cross-sectional view showing a vehicle head lamp 1 according to a fourth embodiment of the present invention.

FIG. 7 is a cross-sectional view showing a vehicle head lamp 1 according to a fourth embodiment of the present invention. In the fourth embodiment, a heat radiation plate 12 is attached to the lighting control circuit 8. The heat radiation plate 12 is a heat radiation member formed by a high thermal-conduction material, for example, such as aluminum. The heat radiation plate 12 is tightly fixed to the end surface 81a of the lighting control circuit 8 by a screw fastener or the like so that heat can be transmitted from the lighting control circuit 8 to the heat radiation plate 12. A wall portion 12a, protruding outside the lamp housing 2 (right side in FIG. 7), is provided on the heat radiation plate 12 all around its peripheral portion. The wall portion 12a is fitted in and is tightly fixed into-the second groove 9b provided in the diaphragm 9. Furthermore, heat radiation fins 12b, for improving heat radiation efficiency, are provided on the heat radiation plate 12.

Also in the vehicle head lamp 1 according to the fourth embodiment described above, the same effects as in the first embodiment can be obtained with respect to cooling the lighting control circuit 8 and sealing the lamp housing 2. Furthermore, also in the vehicle head lamp 1 according to the fourth embodiment, the wall portion 12a of the heat radiation plate 12 can be readily formed in a circular shape or substantially in a circular shape, thereby improving the attachment performance of the diaphragm 9 as in the second embodiment.

Although the lighting control circuit 8 is formed as a single component in the above first to fourth embodiments, the lighting control circuit 8 may be divided into plural components. For example, the lighting control circuit 8 may be divided into a component constructed by an igniter and a component constructed by a converter and an inverter. The component of the igniter is fixed to the reflector 3, and the component of the converter and the inverter is fixed into the lamp housing at a suitable portion. The component of the igniter is connected to the component of the converter and the inverter by electrical wires.

Figure 8:
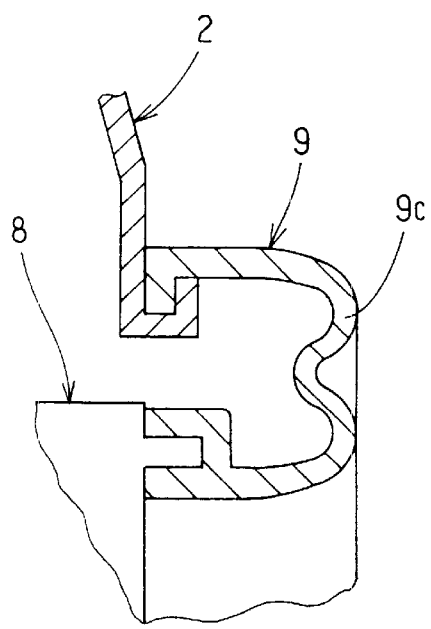
FIG. 8 is an enlarged cross-sectional view showing an attachment structure between a diaphragm and a lamp housing at the opening according to a modification of the present invention.

An attachment structure may be a structure as shown in FIG. 8 between the diaphragm 9 and the lamp housing 2 at the opening 2b. Accordingly, when the diaphragm 9 is adjusted to posture changes of the reflector 3 and is deformed, the diaphragm 9 is difficult to remove from the lamp housing 2 at the opening 2b.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A vehicle head lamp comprising:
    a discharge lamp bulb;
    a reflector for reflecting light emitted from the discharge lamp bulb;
    a lighting control circuit fixed onto a rear surface of the reflector and directly connected to the discharge lamp bulb for lighting the discharge lamp bulb;
    a seal member formed by a flexible material substantially in an annular shape; and
    a lamp housing in which the discharge lamp bulb, the reflector and the lighting control circuit are contained, the lamp housing defining an opening at a side of the lighting control circuit, wherein:
    an end portion of the lighting control circuit is exposed through the opening exterior to the lamp housing;
    an outer circumferential portion of the seal member is tightly fixed to the lamp housing around a peripheral portion of the opening; and
    an inner circumferential portion of the seal member contacts a peripheral portion of the lighting control circuit.

2. The vehicle head lamp according to claim 1, further comprising an actuator for moving the reflector.

3. The vehicle head lamp according to claim 2, further comprising a heat radiation member formed from a high thermal-conduction material, the heat radiation member fixed to the lighting control circuit, wherein the seal member contacts the heat radiation member.

4. The vehicle head lamp according to claim 3, wherein the heat radiation member includes heat radiation fins exposed from the opening outside the lamp housing.

5. The vehicle head lamp according to claim 3, wherein the seal member is constructed by a plurality of components.

6. The vehicle head lamp according to claim 3, wherein the seal member contains a bellows portion to facilitate expansion and contraction of the seal member.

7. The vehicle head lamp according to claim 2, wherein the seal member is constructed by a plurality of components.

8. The vehicle head lamp according to claim 1, further comprising a heat radiation member formed from a high thermal-conduction material, the heat radiation member fixed to the lighting control circuit, wherein the seal member contacts the heat radiation member.

9. The vehicle head lamp according to claim 8, wherein the seal member is constructed by a plurality of components.

10. The vehicle head lamp according to claim 8, wherein the heat radiation member includes heat radiation fins exposed from the opening outside the lamp housing.

11. The vehicle head lamp according to claim 1, wherein the lighting control circuit includes heat radiation fins exposed through the opening outside the lamp housing.

12. The vehicle head lamp according to claim 2, wherein the lighting control circuit includes heat radiation fins exposed through the opening outside the lamp housing.

13. The vehicle head lamp according to claim 12, wherein the seal member is constructed by a plurality of components.

14. The vehicle head lamp according to claim 11, wherein the seal member is constructed by a plurality of components.

15. The vehicle head lamp according to claim 1, wherein the seal member is constructed by a plurality of components.

16. The vehicle head lamp according to claim 1, wherein the seal member contains a bellows portion to facilitate expansion and contraction of the seal member.

17. The vehicle head lamp according to claim 1, wherein the reflector pivots according to the limits permitted by the seal member in order to adjust a direction of light reflected.

18. The vehicle head lamp according to claim 2, wherein the seal member contains a bellows portion to facilitate expansion and contraction of the seal member.

* * * * *